United States Patent
Wei

(10) Patent No.: US 8,320,128 B2
(45) Date of Patent: Nov. 27, 2012

(54) SERVER SYSTEM AND HEAT DISSIPATION DEVICE THEREOF

(75) Inventor: Chao-Ke Wei, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 203 days.

(21) Appl. No.: 12/909,864

(22) Filed: Oct. 22, 2010

(65) Prior Publication Data

US 2012/0044632 A1  Feb. 23, 2012

(30) Foreign Application Priority Data

Aug. 23, 2010 (TW) .............................. 99128125 A

(51) Int. Cl.
*H05K 7/20* (2006.01)

(52) U.S. Cl. .............. 361/695; 361/679.47; 361/679.53; 361/696; 361/699; 165/80.4; 165/104.19; 165/104.21; 165/104.33; 165/185; 62/259.2

(58) Field of Classification Search .......... 361/679.46–679.53, 688, 724–728, 361/831; 165/80.2–80.5, 104.19, 104.21, 165/104.33, 104.34, 185; 312/223.2, 223.3, 312/236; 454/137, 184; 62/59, 135, 137, 62/259.2

See application file for complete search history.

(56) References Cited

U.S. PATENT DOCUMENTS

| | | | | |
|---|---|---|---|---|
| 5,150,277 | A * | 9/1992 | Bainbridge et al. | 361/695 |
| 6,034,873 | A * | 3/2000 | Ståhl et al. | 361/701 |
| 7,278,273 | B1 * | 10/2007 | Whitted et al. | 62/259.2 |
| 7,325,410 | B1 * | 2/2008 | Bean, Jr. et al. | 62/137 |
| 7,367,384 | B2 * | 5/2008 | Madara et al. | 165/122 |
| 7,738,251 | B2 * | 6/2010 | Clidaras et al. | 361/701 |
| 7,800,900 | B1 * | 9/2010 | Noteboom et al. | 361/679.47 |
| 7,944,692 | B2 * | 5/2011 | Grantham et al. | 361/688 |
| 7,957,142 | B2 * | 6/2011 | Noteboom et al. | 361/696 |
| 7,961,463 | B2 * | 6/2011 | Belady et al. | 361/695 |
| 7,971,446 | B2 * | 7/2011 | Clidaras et al. | 62/259.2 |
| 7,990,710 | B2 * | 8/2011 | Hellriegel et al. | 361/699 |
| 8,031,468 | B2 * | 10/2011 | Bean et al. | 361/696 |
| 8,081,459 | B2 * | 12/2011 | Doll et al. | 361/696 |
| 8,180,495 | B1 * | 5/2012 | Roy | 700/278 |
| 8,184,435 | B2 * | 5/2012 | Bean et al. | 361/696 |

* cited by examiner

Primary Examiner — Michail V Datskovskiy
(74) Attorney, Agent, or Firm — Altis Law Group, Inc.

(57) ABSTRACT

An exemplary server system includes a server cabinet, multiple racks arranged in the server cabinet, multiple servers mounted on the racks, and a heat dissipation device for cooling the servers. The heat dissipation device includes a fan module and a dissipating module. The fan module is arranged over the racks for generating downwards airflow across the servers to exchange heat with the servers. The dissipating module is arranged over the racks to exchange heat with the airflow after the airflow passes the servers.

16 Claims, 2 Drawing Sheets

SERVER SYSTEM AND HEAT DISSIPATION DEVICE THEREOF

BACKGROUND

1. Technical Field

The present disclosure relates to heat dissipation, and more particularly to a server system and heat dissipation device used by the server system.

2. Description of Related Art

For unified management, many servers are densely arranged in a single cabinet. Each of the servers includes at least a power supply device, a motherboard, a hard disk drive, and an optical disk drive, and thus considerable heat is generated during operation. If the heat is not efficiently removed, the servers may suffer damage.

What is needed, therefore, is a server system and heat dissipation device which can overcome the limitations described.

DETAILED DESCRIPTION

Figure 1:
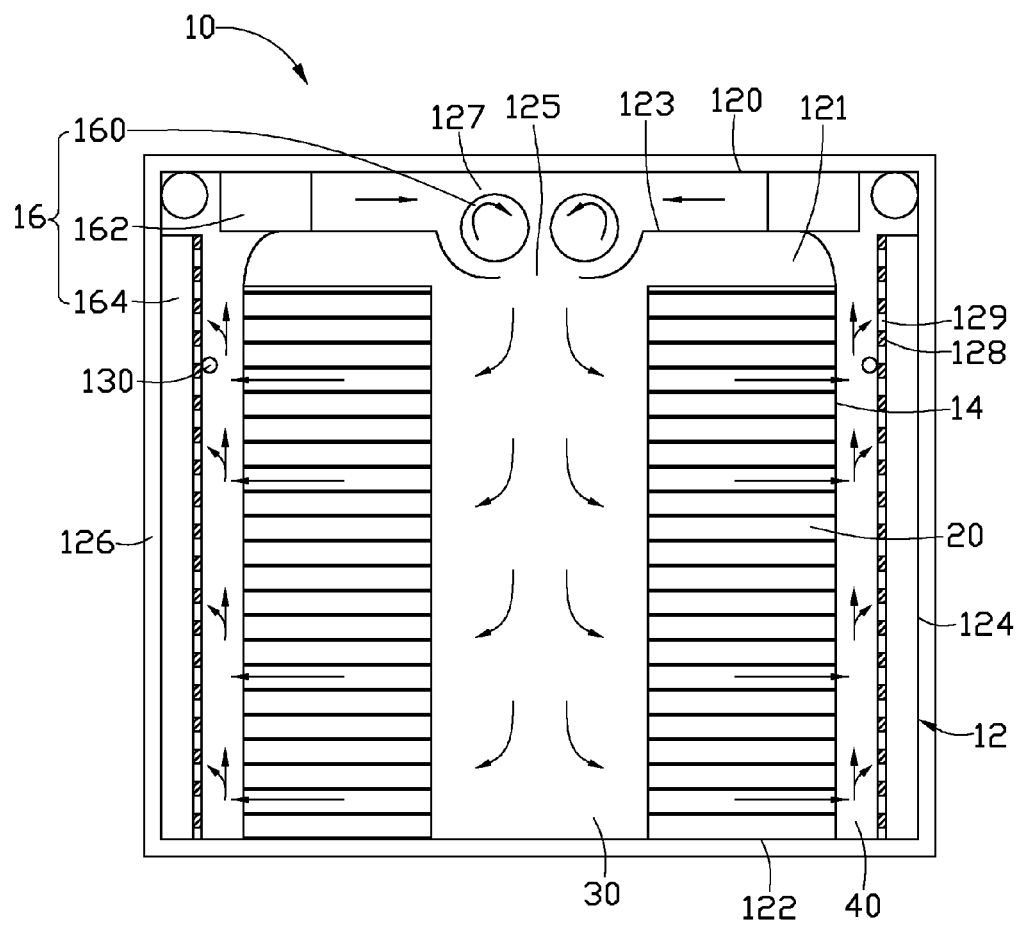
FIG. 1 is a schematic view of a server system in accordance with an embodiment of the disclosure.

Referring to FIG. 1, a server system 10 in accordance with an exemplary embodiment is shown. The server system 10 includes a server cabinet 12, a plurality of racks 14 accommodated in the server cabinet 12, a plurality of servers 20 mounted on the racks 14, and a heat dissipation device 16 for cooling the servers 20.

The server cabinet 12 includes a top plate 120, a bottom plate 122 under the top plate 120, a left plate 126 interconnecting left edges of the top plate 120 and the bottom plate 122, and a right plate 124 interconnecting right edges of the top plate 120 and the bottom plate 122.

Two separating plates 128 extend up from the bottom plate 122 towards the top plate 120. In this embodiment, the two separating plates 128 are respectively located adjacent and parallel to the left plate 126 and the right plate 124. A left chamber (not labeled) is defined between the left plate 126 and one of the two separating plates 128 near the left plate 126, a right chamber (not labeled) is defined between the right plate 124 and the other separating plate 128 near the right plate 124, a receiving chamber 121 is defined between the two separating plates 128 receiving the racks 14, and a top chamber 127 is defined between top ends of the separating plates 128 and the top plate 120. Each separating plate 128 defines a plurality of ventilating holes 129 therethrough for communicating the receiving chamber 121 with the left/right chamber.

A temperature sensor 130 is mounted on an inner side of each separating plate 128 facing the receiving chamber 121 for detecting temperature of the receiving chamber 121. In this embodiment, the temperature sensors 130 are located adjacent to the top ends of the separating plates 128.

The racks 14 are arranged in the receiving chamber 121, and evenly distributed between the separating plates 128. In this embodiment, the server cabinet 12 has two racks 14 received therein. Alternatively, a size of the server cabinet 12 can be modified to accommodate more racks 14 therein, thereby mounting more servers 20 according to needs.

Figure 2:
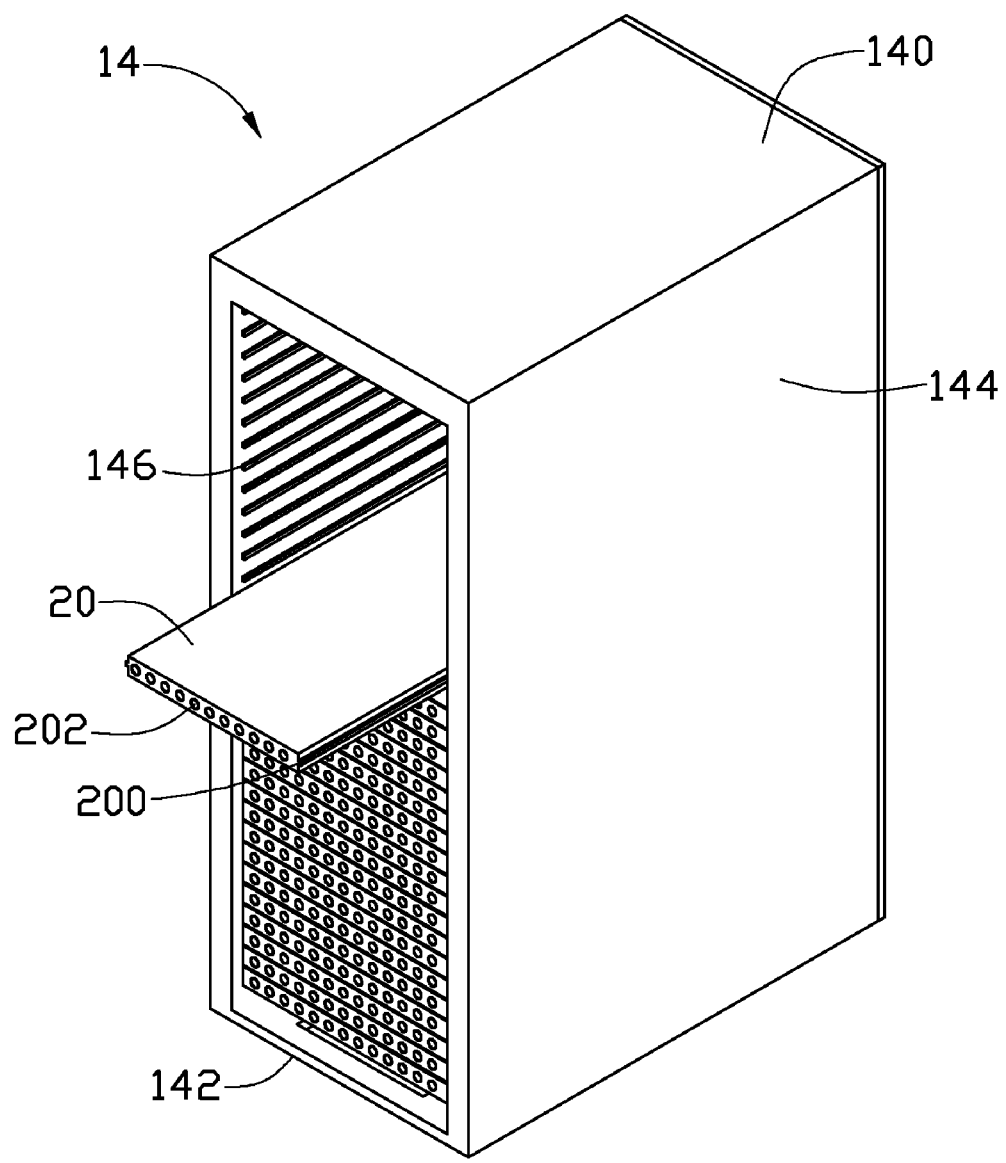
FIG. 2 is a schematic view of a rack of the server system of FIG. 1 with a plurality of servers mounted thereon.

Referring to FIG. 2, each rack 14 includes a rectangular top surface 140, a bottom surface 142 parallel to and spaced from the top surface 140, and two sidewalls 144 respectively interconnected between front and rear sides of the top surface 140 and the bottom surface 142. That is, left and right sides of the rack 14 are open. When assembled, the racks 14 are mounted in the server cabinet 12 with the open sides facing the separating plates 128. A passage 30 is formed between the racks 14. A channel 40 is defined between each separating plate 128 and the corresponding neighboring rack 14.

Each of the racks 14 has a plurality of servers 20 stacked along an upward axis thereof. For facilitating installation of the servers 20 to the rack 14, a plurality of sliding rails 146 is formed on the sidewalls 144 of the rack 14 and evenly distributed along the upward axis of the rack 14, and each server 20 has two guiding bars 200 respectively formed at front and rear sides thereof matching sliding rail 146. When assembled, the servers 20 respectively slide along the sliding rails 146 into the rack 14. A plurality of through holes 202 is defined in each of the servers 20, extending from the left side through the right side for ventilation. After assembly, the through holes 202 of the servers 20 are oriented towards the separating plates 128.

A supporting board 123 is arranged on top sides of the racks 14. The supporting board 123 defines an opening 125 at the center thereof. In this embodiment, the opening 125 is aligned with the passage 30.

The heat dissipation device 16 includes a fan module 160, a first dissipating module 162 and a second dissipating module 164. In this embodiment, the fan module 160 is received in the top chamber 127, and includes two fans arranged on the supporting board 123 with air outlets thereof facing the opening 125, and air intakes thereof respectively facing the left plate 126 and the right plate 124. The fans can be centrifugal fans or crossflow fans. Circuits of the fans are respectively connected to the temperature sensors 130 to control rotation of the fans.

In this embodiment, the first dissipating module 162 is also received in the top chamber 127, and includes two ice water exchangers. The two ice water exchanges are fixed on the top plate 120 of the server cabinet 12. Each of the ice water exchangers is located over one rack 14, and is substantially aligned with one corresponding channel 40.

The second dissipating module 164 includes two ice water exchangers respectively accommodated in the left chamber and the right chamber. A top of each of the ice water exchangers of the second dissipating module 164 is substantially at the same level as the top ends of the separating plates 128.

During operation of the servers 20, the fan module 160 draws cooling air therearound to form airflow down to the passage 30 via the opening 125 of the supporting board 123. The airflow then distributes into a plurality of branches to flow transversally through the through holes 202 of the servers 20, thereby exchanging heat with the servers 20. The airflow across the servers 20 is heated, and rises along the channels 40, during which, a portion of the heated airflow flows through the ventilating holes 129 of the separating plates 128 to exchange heat to the second dissipating module 164, and the remaining heated airflow flows up to exchange heat to the first dissipating module 162. Finally the heat is dissipated to an exterior of the server system 10 by the first dissipating module 162 and the second dissipating module 164. Therefore, the heat generated by the servers 20 can be evacuated by the heat dissipation device 16, and accordingly the servers 20 maintain a low working temperature.

It is to be understood, however, that even though numerous characteristics and advantages of certain embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A server system, comprising:
a server cabinet;
a plurality of racks arranged in the server cabinet;
a plurality of servers mounted on the racks; and
a heat dissipation device comprising a fan module and a dissipating module, the fan module arranged over the racks for generating downwards airflow across the servers to exchange heat therewith, and the dissipating module arranged over the racks to exchange heat with the airflow after the airflow passes the servers;
wherein the server cabinet comprises a top plate, a bottom plate under the top plate, a left plate interconnecting left edges of the top and bottom plates, and a right plate interconnecting right edges of the top and bottom plates, and wherein the racks are distributed between the left and right plates with open sides thereof oriented towards the left and right plates.

2. The server system of claim 1, further comprising a supporting board arranged on the racks, the supporting board defining an opening at the center thereof, and the fan module arranged on the supporting board with the air outlet thereof facing the opening.

3. The server system of claim 2, wherein the fan module comprises two centrifugal fans, air intakes of which are respectively oriented towards the left and right plates.

4. The server system of claim 2, wherein the fan module comprises two crossflow fans, air intakes of which are respectively oriented towards the left and right plates.

5. The server system of claim 1, wherein the server cabinet further comprises two separating plates extending up from the bottom plate, parallel to and spaced from the left and right plates, and wherein the racks are located therebetween, and a channel is defined between each separating plate and the racks.

6. The server system of claim 5, wherein the dissipating module comprises two heat exchangers fixed on the top plate, each aligned with one channel.

7. The server system of claim 5, wherein the heat exchangers are ice water exchangers.

8. The server system of claim 5, further comprising two additional heat exchangers, one sandwiched between the left plate and the corresponding separating plate, and the other sandwiched between the right plate and the corresponding separating plate.

9. The server system of claim 8, wherein each of the separating plates defines a plurality of through holes.

10. The server system of claim 5, further comprising a temperature sensor arranged on the separating plates to control rotation of the fan module.

11. A server system, comprising:
a server cabinet comprising two parallel plates and a top plate interconnecting tops of the two parallel plates;
a plurality of racks arranged between the two parallel plates on which servers are mounted, the racks spaced from each other and the two parallel plates; and
a heat dissipation device mounted in the server cabinet, comprising a fan module for generating downward airflow to exchange heat with the servers, and a plurality of heat exchangers fixed on the top plate respectively disposed on the racks with distances between the racks and the heat exchangers to exchange heat with the airflow after passing the servers.

12. The server system of claim 11, further comprising two additional heat exchangers, each disposed between one of the two parallel plates of the server cabinet and an outmost rack.

13. The server system of claim 12, wherein the heat exchangers and the additional heat exchangers are ice water heat exchanger.

14. The server system of claim 12, further comprising a separating plate disposed between each of the additional heat exchangers and the corresponding outmost rack, the separating plate defining a plurality of through holes therethrough.

15. The server system of claim 14, further comprising a temperature sensor mounted on the separating plate to control rotation of the fan module.

16. The server system of claim 14, wherein the server cabinet further comprises a bottom plate interconnecting bottoms of the two parallel plates, the separating plates extending up from the bottom plate towards the top plate.

\* \* \* \* \*